(12) United States Patent
Howard et al.

(10) Patent No.: US 7,134,885 B1
(45) Date of Patent: Nov. 14, 2006

(54) MINIATURE HOUSING WITH STANDARD ADDRESSABLE INTERFACE FOR SMART SENSORS AND DRIVE ELECTRONICS

(75) Inventors: David E. Howard, Hazel Green, AL (US); Dennis A. Smith, Athens, AL (US); Dean C. Alhorn, Huntsville, AL (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 11/185,132

(22) Filed: Jul. 20, 2005

(51) Int. Cl.
*H01R 12/00* (2006.01)
(52) U.S. Cl. .................................... 439/76.1
(58) Field of Classification Search ............... 439/76.1, 439/607–610, 358, 76.2, 493, 357, 571
See application file for complete search history.

(56) References Cited

U.S. PATENT DOCUMENTS

| | | | |
|---|---|---|---|
| 3,925,710 A | 12/1975 | Ebert | |
| 5,043,695 A | 8/1991 | Simon et al. | |
| 5,797,771 A * | 8/1998 | Garside | 439/610 |
| 6,095,862 A | 8/2000 | Doye et al. | |
| 6,195,493 B1 | 2/2001 | Bridges | |
| 6,210,229 B1 * | 4/2001 | Lai | 439/610 |
| 6,385,036 B1 | 5/2002 | Chien | |
| 6,501,020 B1 | 12/2002 | Grant et al. | |
| 6,541,704 B1 | 4/2003 | Levenson et al. | |
| 6,603,657 B1 | 8/2003 | Tanzer et al. | |
| 6,661,651 B1 | 12/2003 | Tanzer et al. | |
| 6,960,100 B1 * | 11/2005 | Ruff et al. | 439/571 |
| 2002/0101041 A1 | 8/2002 | Kameyama | |

* cited by examiner

*Primary Examiner*—J. F. Duverne
(74) *Attorney, Agent, or Firm*—James J. McGroary; George P. Kobler

(57) ABSTRACT

A miniature assembly is disclosed which includes a housing assembly with a cover configured to be sealably secured to a box-like receptacle. The receptacle comprises openings on opposing sides for the seating therein of communications connectors. Enclosed within housing is custom-sized circuit board for supporting, at least, a standard communications interface and at least one electronic device.

20 Claims, 4 Drawing Sheets

MINIATURE HOUSING WITH STANDARD ADDRESSABLE INTERFACE FOR SMART SENSORS AND DRIVE ELECTRONICS

STATEMENT OF FEDERALLY SPONSORED RESEARCH/DEVELOPMENT

The invention described herein was made by an employee of the United States Government and may be manufactured and used by or for the Government for Government purposes without the payment of any royalties thereon or therefore.

BACKGROUND

1. Field

Present invention relates generally to miniature housing assemblies for control of electronic devices, and, in particular, to miniature housing assemblies that incorporate a standard communications interface for control of multiple electronic devices.

2. Description of the Related Art

Smart sensors, data recorders, electronic drives and other devices are often controlled by a programmable logic controllers, or PLC's. As the term is used herein, a PLC is an industrial control computer, typically implemented to run automated processes. PLC's tend to be relatively large structurally, e.g., on the order of about 4 to 5 inches in length and 3 to 4 inches in width, or greater, and a single PLC is often used to control a single electronic, or electromechanical device. The controlled devices are often separate from the PLC. Design of such systems requires consideration of thermal dissipation in the environment in which they operate to avoid failure due to over heating. Therefore, the layout of a system incorporating a PLC controlling electronic devices often dictates a certain amount of space. Further, depending on the number of devices to be controlled, communications among the devices may be complex also dictating a certain spatial size.

To meet desires to cut costs under austere funding rubrics, the weight and size of such systems is ever decreasing, particularly in flight and space flight systems. Decreased weight also enhances flight kinematics. Decreasing space requirements mandate a decrease in size of the constituent components, or a more efficient system integration, or both.

Moreover, PLC's may need to be "ruggedized," or, adapted to housings that make the PLC resistant to vibration, shock and other hazards. This also increases the weight as well as the cost of production.

Therefore, a need exists for an assembly that allows for the control of multiple electronic devices, possibly from a single control processor. The assembly needs to be of a miniature size and incorporate a communications interface that permits communications between the control processor and the device to be controlled. A need further exists for such an assembly to be easily thermally dissipated. Finally, such an assembly needs to be vibration and shock resistant.

SUMMARY

The present disclosure is directed to a miniature assembly including a standard communications interface that satisfies this need.

For purposes of summarizing the invention, certain aspects, advantages, and novel features of the invention have been described herein. It is to be understood that not necessarily all such advantages may be achieved in accordance with any one particular embodiment of the invention. Thus, the invention may be embodied or carried out in a manner that achieves or optimizes one advantage or group of advantages as taught herein without necessarily achieving other advantages as may be taught or suggested herein.

A miniature assembly according to the present invention includes a housing assembly with a cover configured to be sealably secured to a box-like receptacle. The receptacle comprises openings on opposing sides for the seating therein of communications connectors. Enclosed within housing is custom-sized circuit board for supporting, at least, a standard communications interface and at least one electronic device.

In another embodiment, the assembly includes a carrier upon which the housing assembly is mounted.

In still another embodiment, the receptacle is configured with mounting extensions with mounting apertures bored therethrough for mounting to the carrier.

In another embodiment, the receptacle is configured with at least one aperture in a wall for the injection into the sealed housing of potting solution.

In a further embodiment, the circuit board is configured with at least one recessed cut-out in at least one edge.

In still a further embodiment, the electronic devices are at least one of smart sensors, data recorders, controllers and drives or the like.

These and other embodiments of the present invention will also become readily apparent to those skilled in the art from the following detailed description of the embodiments having reference to the attached figures, the invention not being limited to any particular embodiment(s) disclosed.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

The various embodiments of the present invention and their advantages are best understood by referring to FIGS. 1 through 7 of the drawings. The elements of the drawings are not necessarily to scale, emphasis instead being placed upon clearly illustrating the principles of the invention. Throughout the drawings, like numerals are used for like and corresponding parts of the various drawings.

Figures 1A, 1B:
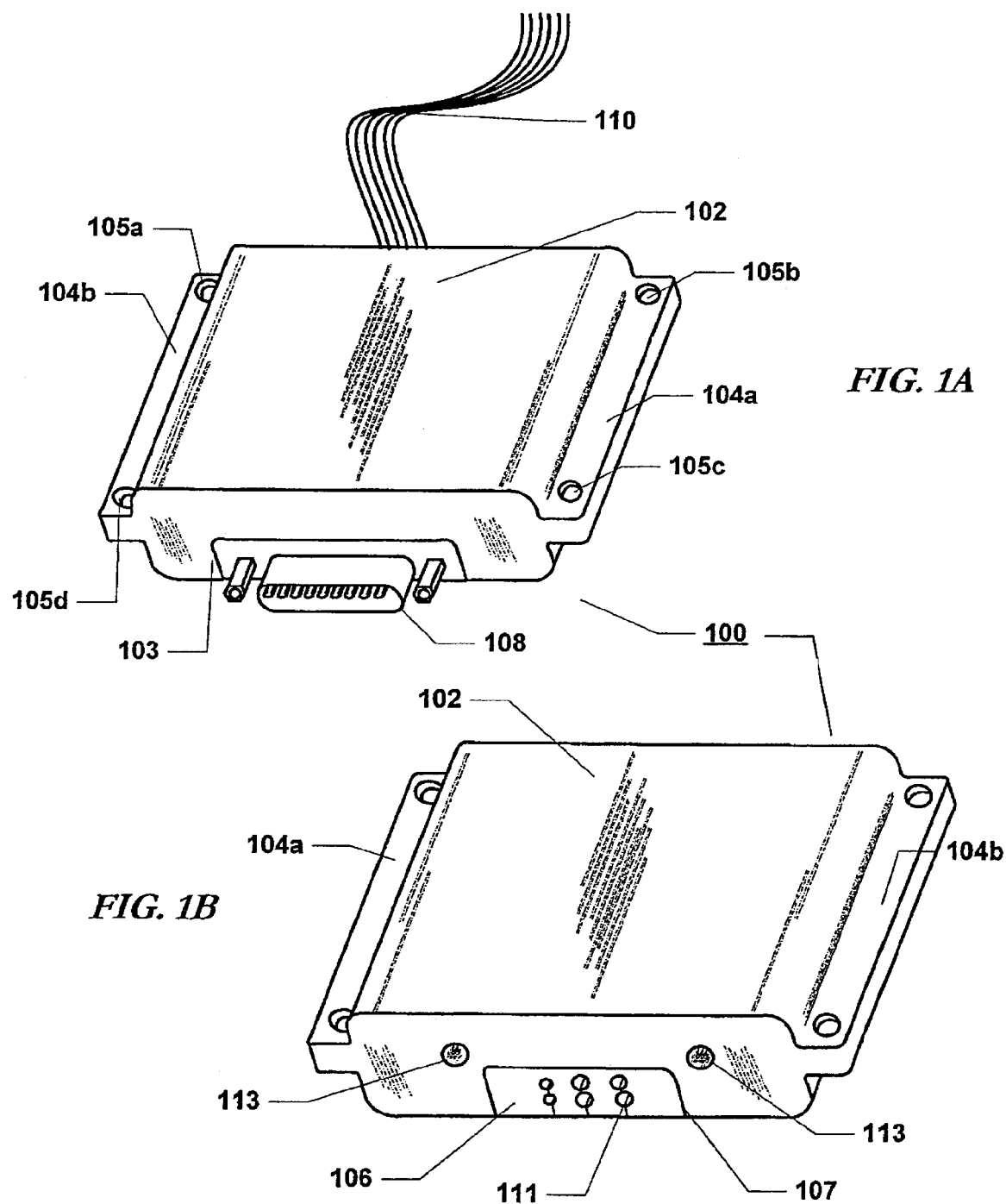
FIG. 1A is a perspective view of one embodiment of the assembly according to the present invention.
FIG. 1B is a perspective view, rotated 180° with respect to the view of FIG. 1A, showing an embodiment of the assembly according to the present invention.

FIG. 1A presents a perspective view of one side of the novel assembly 100 according to an embodiment of the present invention showing housing 102 from which extends to either side mounting extensions 104a, b. Mounting extensions 104a, b are bored through with mounting apertures 105a–d. Communications connector 108 extends from housing 102 through a first opening 103 in a wall of the housing. Opening is dimensioned so that communications connector 108 may be received securely therein. Extending from the opposing side of housing 102 from communications connector 108 are lines 110, or wires or cables, for external coupling of the assembly with other devices.

FIG. 1B presents a perspective view of the opposing side of assembly 100 where again is shown housing 102 and mounting extensions 104a, b. In this embodiment, grommet 106 is fitted within second opening 107 in a second wall of the housing, and is used for support of lines 110 that may extend from assembly 100. Grommet 106 may be of any suitable flexible, lightweight material, for example, silicon, and may have bored therethrough one or more line apertures 111 for insertion therein of lines 110. Each line aperture 111 is preferably sized to securely receive a line supported by grommet 106 and may be cut along the longitudinal axis of the aperture to permit insertion of the line. Housing 102 may also comprises one or more potting apertures 113 for the injection into housing 102 of a potting solution.

It should be noted that the embodiment shown and described in FIGS. 1A, and B depict a configuration where lines 110 extend from assembly 100 supported by grommet 106. However, those skilled in the art will appreciate that other forms of achieving coupling of the assembly to external devices could be implemented. For example, a miniature connector, such as the connector used for communications connector could be employed. Communications connector 108 may be any suitable standard communication connector known by those skilled in the art or hereafter developed. A prototype has been constructed using, as a non-limiting example, an Airborne MS-262-0210435-220S connector.

It should further be noted that mounting extensions 104a, b are optional. Assembly 100 may be formed without extensions 104a, b and still be within the scope of the present invention.

Figure 2:
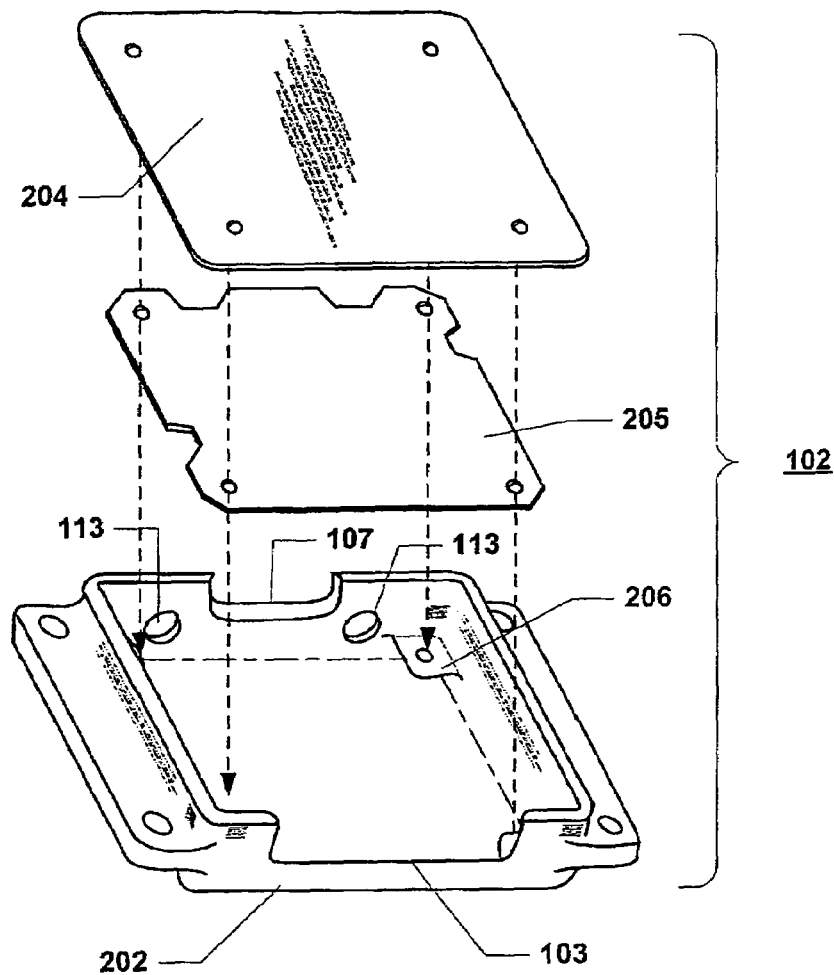
FIG. 2 is an exploded perspective view inverted with respect to FIGS. 1A & B, showing an embodiment of the assembly according to the present invention.

Referring to FIG. 2 wherein assembly 100 is depicted in an exploded, perspective view, housing 102 comprises receptacle 202 and cover 204. It can be seen from this aspect, i.e. inverted with respect to FIG. 1A, B, that receptacle 202 comprises first and second openings 103, 107 as well as potting apertures 113.

Figure 3A:
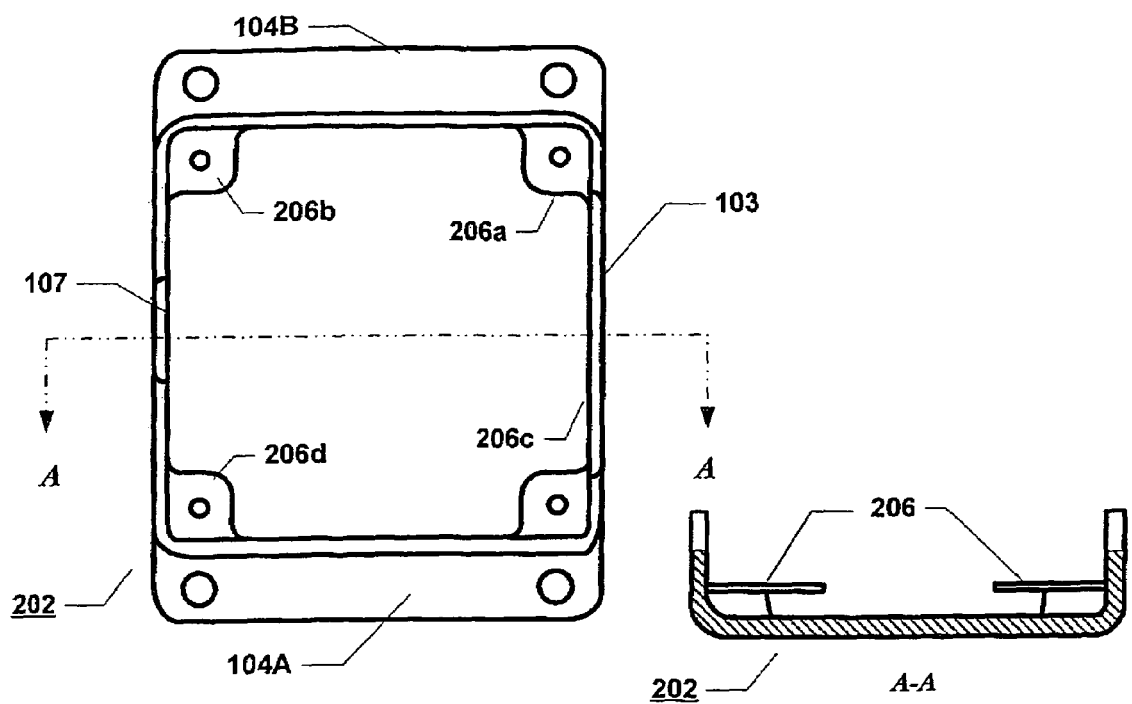
FIG. 3A is a plan view of the receptacle with an accompanying cross-sectional view along line A—A according to an embodiment of the present invention.
Figure 3B:
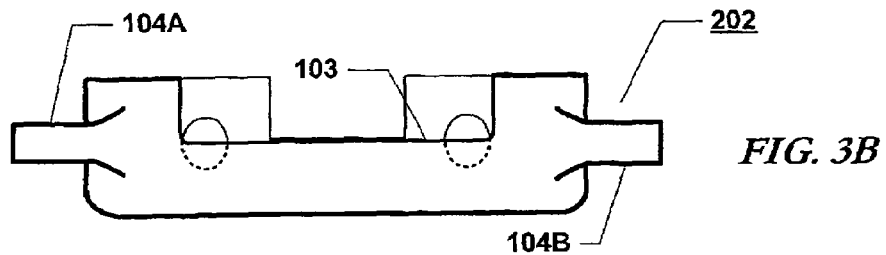
FIG. 3B is an elevational view of the receptacle according to one embodiment of the present invention.
Figure 3C:
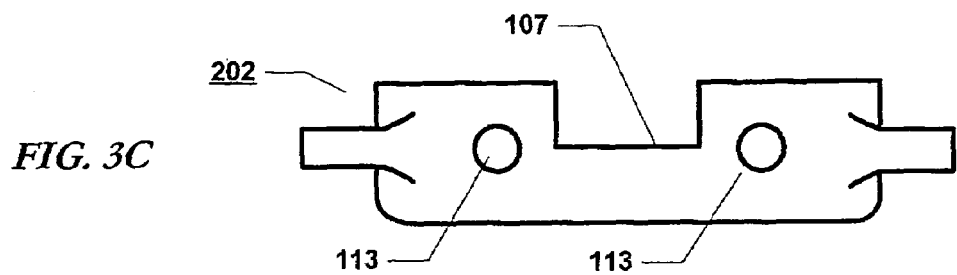
FIG. 3C is an elevational view of the receptacle rotated 180° with respect to the view of FIG. 3B.

Circuit board 205 is received within receptacle 202 and cover 204 sealably encloses circuit board 205 therein. FIG. 3A is a plan view of receptacle 202 depicting mounting extensions 104a, b and connector openings 103, 107. Also shown in the Figure are flanges 206a–d having mounting apertures disposed therein. As shown in the accompanying cross-section view, flanges 206a–d extend from the walls forming the vertices of receptacle 202, and elevated from floor of receptacle 202. Flanges 206a–d may be supported by support material. FIG. 3B shows in detail first opening 103 for communications connector, and FIG. 3C shows in detail second opening 107 with potting solution apertures 113.

A prototype miniature assembly includes a housing that is about 2.25" by about 1.75" by about 0.5", far less than the size of a typical PLC. Further, weight of a fully potted assembly is about 94 grams.

Referring back to FIG. 2, circuit board 205 rests upon flanges 206 and is secured thereto with a fastener means through circuit board mounting apertures and which are received by flange 206 mounting apertures. To complete the assembly, cover 204 is configured with attachment apertures through which fastener means are inserted. Attachment apertures are disposed within cover to be aligned with circuit board mounting apertures and flange mounting apertures. One fastener means may be used in each aperture inserted through both cover 204 attachment aperture and circuit board 205 mounting aperture to be received by flange 206 mounting aperture. Alternatively, circuit board 205 may be mounted to flanges 206 with fasteners comprising a female portion opposite the male end. Then cover may be attached using a separate set of fastener means, inserted through cover 204 attachment apertures and received by the female portion of the circuit board mounting fasteners.

Figure 4:
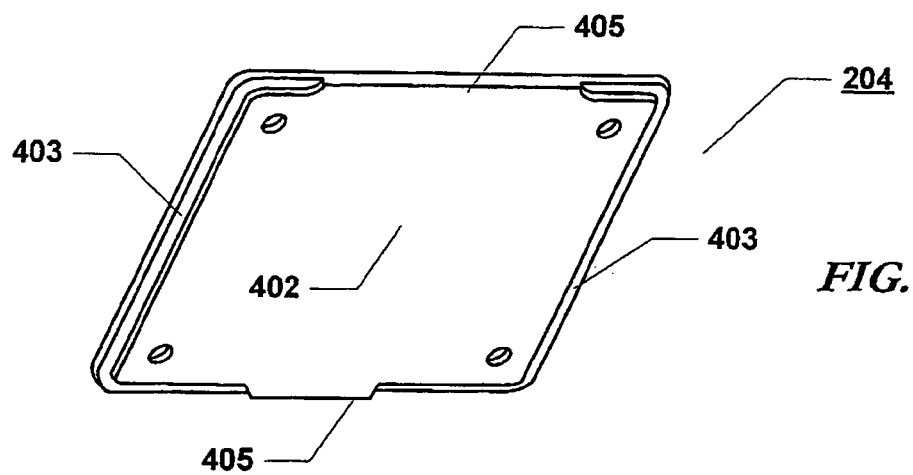
FIG. 4 is a perspective view of the interior side of an exemplary cover for the novel assembly according to one embodiment of the present invention.

FIG. 4 is a perspective view of cover 204 showing the interior side thereof. Cover 204 is configured to sealably enclose assembly, in this embodiment having a raised portion 402 recessed from the edges of cover 204, excluding two opposing portions of the edges 405. The distance of the recession 403 corresponds to the thickness of the wall of receptacle 202 upon which cover 204 is fitted. The non-recessed portions 405 correspond to the openings 103, 107 in walls of receptacle 202. As will be appreciated by those skilled in the relevant arts with the benefit of reading this disclosure, raised portion 402 fits within walls of receptacle 202 and recessed portions 403 are seated upon receptacle 202 wall rims. The non-recessed portions 405 are dimensioned to fit snugly within openings 103, 107 abutted snugly by communications connector, connector means, or line support means, as the case may be.

Figure 5:
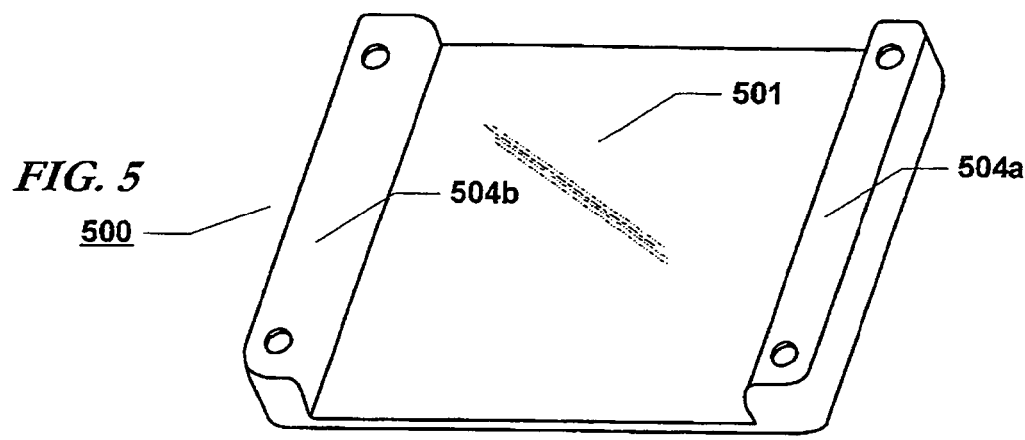
FIG. 5 is a perspective view of an exemplary carrier mount for novel assembly according to one embodiment of the present invention.

There may occur circumstances in which it is desirable to affix assembly 100 on or in a structure, for example on a wall. FIG. 5 illustrates a carrier mount 500 for assembly 100. Carrier 500 includes cradle 501 which is bounded on two opposing sides by elevated extension supports 504a, b. When assembled in this configuration, the embodiment of assembly which includes mounting extensions 104a, b is intended to be used. The main body of assembly 100 rests within cradle 501 with mounting extensions 104a, b resting upon extension supports 504a, and b. Extension supports 504a, b comprise apertures for receiving fastener means inserted through mounting apertures 105 by which assembly 100 is secured to carrier 500. Additionally, assembly may also be secured by an adhesive solution, for example, epoxy. In some applications, it may be desirable to include a thermally insulated pad between carrier 500 and assembly 100. The entire assembly may be secured or affixed to a structure using adhesive or fastener means.

Assembly 100 may also be affixed to structures by simply using an adhesive, for example epoxy. Alternatively, receptacle 202 may be configured such that the mounting extensions are generally flush with the surface of the assembly that will rest on such a structure and fastener means may be used to secure assembly directly to such structure. Those skilled in the arts will recognize that there exist a variety of ways to attach assembly 100 to a structure, however.

Figure 6:
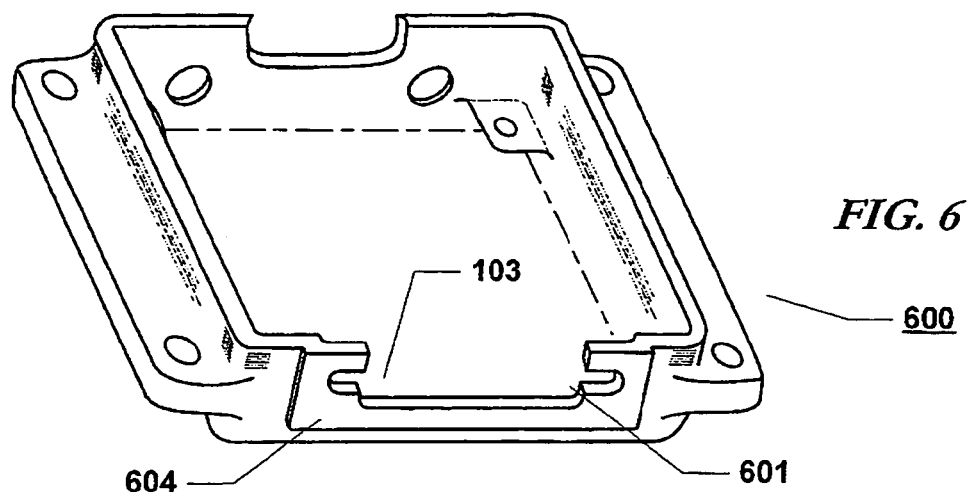
FIG. 6 is a perspective view of an assembly receptacle according to another embodiment of the present invention.

FIG. 6 displays an alternative receptacle 600 wherein opening 103 is adapted by forming therein a slot 601 and including extra material in the face 604 thereof. In this manner, receptacle may serve as housing for communications connector and insuring an improved electrical bond between assembly and connector.

Figure 7:
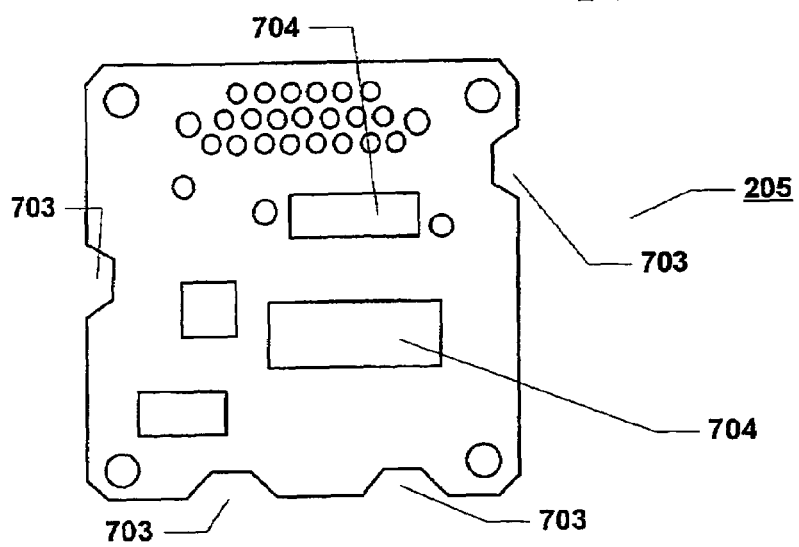
FIG. 7 is a plan view of an exemplary custom-sized circuit board according to one embodiment of the present invention.

Referring to FIG. 7, exemplary circuit board 205 is a custom-sized circuit board for supporting electronics 704 enclosed within assembly housing 102. Specifically, circuit board provides support for at least, a standard communications interface and one or more electronic devices, and includes a power source as would be understood by those skilled in the art. Standard communications interface can be any standard communications interface, for example, the model known to those in the art as the RS-485 interface. Communications interface may also be an Ethernet interface or other addressable interface.

Advantageously, the assembly provides housing for a circuit board supporting and providing communication with a variety of electronics devices, both internal and external. Electronic devices include, without limitation, smart sensors and electronics for driving other systems, and data recorders, controllers, electronic instrumentation and actuators. Non-limiting examples of drive electronics include relay drives, thruster drives, motor drives, and solenoid valve drives. A non-limiting example of a smart sensor is a programmable thermostat. The type and number of varied electronic devices encased within housing is limited only by the size of the circuit board and the housing assembly. For example, a prototype has been tested that includes a programmable thermostat and a data recorder. The specific circuit board layout for each possible combination is subject to design choices as will be appreciated by those skilled in the relevant arts with the benefit of reading this disclosure.

Circuit board 205 includes at least one notched recess 703 in an edge of circuit board 703 and preferably more. Recess 703 allows potting solution injected into housing 102 through apertures 113 to fill in the opposing side of the interior of housing 102 as well as the side from which potting solution was injected.

As would be appreciated by those skilled in the art, the communications interface supported by circuit board typically comprises a microcontroller. A microcontroller is another form of processor. A processor comprises a memory of some form, and computer control logic (or computer programs) stored within such memory. Such computer control logic, when executed, enables the computer system to perform certain features of the present invention as discussed herein. In particular, the computer programs, when executed, enable a control processor to perform and/or cause the performance of features of the present invention. Accordingly, such computer programs represent controllers of the interface.

Potting solution may be any potting solution, or encapsulant, known in the arts. In some designs it is preferable to use a thermally conductive potting solution, a non-limiting example of which is Stycast® 2850 produced by Emerson & Cuming, Inc., Corporation. Potting solution also provides a robust design for systems intended for heavy vibration, or where electrical shock is a risk.

A further advantage of this novel assembly that will be appreciated by those skilled in the relevant arts is that its thermal characteristics are substantially uniform, allowing the assembly to be heat sunk from any aspect. This provides designers of systems incorporating the assembly wide latitude in placing the assembly within such systems.

It will be appreciated by those skilled in the art that through the incorporation of the standard communications interface, the miniature assembly may allow a single control processor to control a plurality of devices, both electronic and electro-mechanical, by allowing such devices to be linked in a "daisy-chain" fashion, i.e., one or more assemblies linked in succession, to control processor using multiple miniature assemblies. A system would include a processor for providing control outputs to the system where the control outputs are coupled to one or more miniature assemblies. The miniature assemblies having inputs coupled to a communications connector as described above, and an output. The output being coupled to one or more electronic devices. For that matter, several electronic devices may be linked to a single data recorder, or multiple data recorders in the same fashion. The reduced size of assembly 100 means that systems incorporating the assembly need less space and are burdened with less weight.

This invention may be provided in other specific forms and embodiments without departing from the essential characteristics as described herein. The embodiments described above are to be considered in all aspects as illustrative only and not restrictive in any manner. The following claims rather than the foregoing description indicate the scope of the invention.

As described above and shown in the associated drawings, the present invention comprises an apparatus for miniature housing with standard addressable interface for smart sensors and drive electronics. While particular embodiments of the invention have been described, it will be understood, however, that the invention is not limited thereto, since modifications may be made by those skilled in the art, particularly in light of the foregoing teachings. It is, therefore, contemplated by the appended claims to cover any such modifications that incorporate those features or those improvements that embody the spirit and scope of the present invention.

What is claimed is:

1. A miniature assembly for encasing a standard communications interface and one or more electronic devices comprising:
   a. a receptacle, said receptacle having a first side with a first opening disposed therein, and having an opposing second side with a second opening for receiving wire support means, and a plurality of raised flanges disposed about the periphery of the interior of said receptacle and extending inwardly from the walls thereof, each of said flanges having an aperture for receiving a fastener;
   b. a circuit board for supporting said communications interface and said one or more electronic devices, said circuit board having a plurality of apertures corresponding to said apertures of said flanges and mounted within said receptacle upon said raised flanges;
   c. at least one electronic communications connector means seated within either said first or second opening and coupled to said standard communications interface; and
   d. a cover configured to sealably enclose said receptacle, said cover having a plurality of apertures corresponding to said flange apertures for receiving fasteners therethrough for securing said cover to said receptacle.

2. The assembly of claim 1, further comprising a carrier member to which said receptacle and cover assembly is attached.

3. The assembly of claim 2, wherein said receptacle further comprises outwardly tending extensions at opposing ends by which said receptacle and cover assembly is attached to said carrier, said extensions having apertures therethrough for insertion of fastener means.

4. The assembly of claim 1, wherein said receptacle further comprises at least one aperture for injection of potting compound and wherein said assembly further comprises said potting compound.

5. The assembly of claim 4, wherein said circuit board has at least one edge, said at least one edge having at least one recessed cut-out.

6. The assembly of claim 5, wherein said potting compound, is a thermally conductive potting compound.

7. The assembly of claim 1, wherein said electronic devices are smart sensors.

8. The assembly of claim 1, wherein said one of said electronic devices is a programmable thermostat.

9. The assembly of claim 1, wherein said electronic devices are data recorders.

10. The assembly of claim 1, wherein said electronic devices are electronic drives.

11. The assembly of claim 10, wherein said electronic drives are at least one of relay drives, thruster drives, motor drives, and solenoid valve drives.

12. The assembly of claim 1, wherein said electronic devices are controllers.

13. The assembly of claim 1, wherein said communications interface is an addressable communications interface.

14. The assembly of claim 13, wherein said communications interface is an Ethernet interface.

15. A system for the control of electronic devices comprising:
   a. at least one miniature assembly incorporating a standard communications interface, said assembly having a communications input and a communications output, said assembly comprising:
      i. a housing including a receptacle and a cover, said cover configured to sealably enclose said receptacle, said receptacle comprising a plurality of raised flanges disposed about the periphery of the interior of said receptacle, said each of said flanges having an aperture bored therethrough, and having first and second openings in opposing walls of said receptacle;
      ii. a circuit board dimensioned to be received within said receptacle and mounted upon said raised flanges with a plurality of fastener means supporting said standard communications interface;
      iii. a first communications connector seated within said first opening to receive said communications input, said connector being coupled to said communications interface;
      iv. a second communications connector seated within said second opening to be a conduit for said communications output;
   b. a control processor having a control processor output coupled to said communications input; and
   c. at least one electronic device having an input coupled to said communications output.

16. The system of claim 15, wherein further comprising a carrier member to which said housing is attached.

17. The system of claim 16, wherein said receptacle further comprises extensions at opposing ends by which said housing is attached to said carrier, said extensions having apertures therethrough for insertion of fastener means.

18. The system of claim 15, wherein said receptacle further comprises at least one aperture for injection of potting compound and wherein said assembly further comprises said potting compound.

19. The system of claim 18, wherein said circuit board has at least one edge, said at least one edge having at least one recessed cut-out.

20. The system of claim 19, wherein said potting compound is a thermally conductive potting compound.

* * * * *